United States Patent
Honda

(10) Patent No.: US 11,924,955 B2
(45) Date of Patent: Mar. 5, 2024

(54) EXTREME ULTRAVIOLET LIGHT GENERATION APPARATUS AND ELECTRONIC DEVICE MANUFACTURING METHOD

(71) Applicant: Gigaphoton Inc., Tochigi (JP)

(72) Inventor: Yoshiyuki Honda, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 18/052,129

(22) Filed: Nov. 2, 2022

(65) Prior Publication Data

US 2023/0292426 A1    Sep. 14, 2023

(30) Foreign Application Priority Data

Dec. 27, 2021 (JP) ................. 2021-213007

(51) Int. Cl.
  *H05G 2/00* (2006.01)
  *G03F 7/00* (2006.01)
  *G21K 1/06* (2006.01)

(52) U.S. Cl.
  CPC ......... *H05G 2/008* (2013.01); *G03F 7/70033* (2013.01); *G03F 7/70191* (2013.01);
  (Continued)

(58) Field of Classification Search
  CPC ............. G03F 7/70033; G03F 7/70191; G03F 7/70533; G03F 7/70; G03F 7/70025; G03F 7/70041; G03F 7/7015; G03F 7/70141; G03F 7/70575; G03F 7/70483–70541; G03F 7/7055; G03F 7/70566;
  (Continued)

(56) References Cited

U.S. PATENT DOCUMENTS 9,130,345 B2  9/2015  Yanagida et al.
9,357,625 B2  5/2016  Tao et al.
(Continued)

FOREIGN PATENT DOCUMENTS

EP        2538759 A1    12/2012
WO  WO-2019166164 A1 *  9/2019  ............. H05G 2/008

OTHER PUBLICATIONS

A Search Report issued by the Netherlands Patent Office dated Jul. 4, 2023, which corresponds to Dutch Patent Application No. 2033425 and is related to U.S. Appl. No. 18/052,129; with partial English language explanation.

(Continued)

*Primary Examiner* — Christina A Riddle

(74) *Attorney, Agent, or Firm* — Studebaker & Brackett PC

(57) ABSTRACT

An extreme ultraviolet light generation apparatus includes a target supply unit configured to output a droplet target into a chamber device, a prepulse laser light irradiation system configured to irradiate the droplet target with prepulse laser light having linear polarization to generate a diffusion target, and a main pulse laser light irradiation system configured to irradiate the diffusion target with main pulse laser light to generate extreme ultraviolet light. Here, a cross section perpendicular to an optical axis of the main pulse laser light when being radiated to the diffusion target having a shape longer in a polarization direction of the prepulse laser light when being radiated to the droplet target than in directions other than the polarization direction.

15 Claims, 11 Drawing Sheets

(52) U.S. Cl.
CPC ......... *G03F 7/70533* (2013.01); *G21K 1/067* (2013.01); *H05G 2/003* (2013.01)

(58) Field of Classification Search
CPC ............... G03F 7/7095; G03F 7/70958; G03F 7/70966; G03F 7/70975; G03F 7/70991; G03F 1/68; G03F 1/82; G03F 1/84; G03F 7/7085; G03F 7/70605–706851; G21K 1/067; H05G 2/003; H05G 2/00–008; H01S 3/005; H01S 3/0071; H01S 3/0085; H01S 3/02; H01S 3/10; H01S 3/10023; H01S 3/1003; H01S 3/10061; H01S 3/10069; H01S 3/061; H01S 2301/04; H01S 2301/14; H01S 2301/145; H01S 5/005; H01S 5/0057; H01S 5/0071; H01S 5/0085; H01S 5/0087; H01S 3/08059; H01S 3/10046; H01S 3/2391; H01S 3/11; G02B 26/0816; G02B 26/0875; G02B 27/0961; G02B 27/1006; G02B 27/281; G02B 27/285; G02B 27/286
USPC ........................... 355/18, 30, 52–55, 67–77; 250/492.1–429.24, 493.1, 503.1, 504 R
See application file for complete search history.

(56) References Cited

U.S. PATENT DOCUMENTS

| | | | |
|---|---|---|---|
| 10,630,042 | B2 | 4/2020 | Yanagida et al. |
| 2013/0015319 | A1* | 1/2013 | Moriya ................. H05G 2/008 250/201.1 |
| 2013/0105712 | A1 | 5/2013 | Yanagida et al. |
| 2013/0320232 | A1* | 12/2013 | Hori ...................... H05G 2/006 250/432 R |
| 2016/0073487 | A1* | 3/2016 | Yanagida ............... H05G 2/006 250/504 R |
| 2018/0034235 | A1* | 2/2018 | Sytina ................. G03F 7/70033 |

OTHER PUBLICATIONS

Anonymous, "Research Disclosure", Research Disclosure, vol. 592, No. 81, Aug. 1, 2013, 7 pages total, Kenneth Mason Publications, ISSN: 0374-4353.

* cited by examiner

EXTREME ULTRAVIOLET LIGHT GENERATION APPARATUS AND ELECTRONIC DEVICE MANUFACTURING METHOD

The present application claims the benefit of Japanese Patent Application No. 2021-213007, filed on Dec. 27, 2021, the entire contents of which are hereby incorporated by reference.

BACKGROUND

1. Technical Field

The present disclosure relates to an extreme ultraviolet light generation apparatus and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, it is expected to develop a semiconductor exposure apparatus that combines an apparatus for generating extreme ultraviolet (EUV) light having a wavelength of about 13 nm with a reduced projection reflection optical system.

As the EUV light generation apparatus, a laser produced plasma (LPP) type apparatus using plasma generated by irradiating a target substance with laser light has been developed.

PATENT DOCUMENTS

List of Documents

Patent Document 1: U.S. Pat. No. 9,130,345
Patent Document 2: US Patent Application Publication No. 2013/0105712
Patent Document 3: U.S. Pat. No. 9,357,625

SUMMARY

An extreme ultraviolet light generation apparatus according to an aspect of the present disclosure includes a target supply unit configured to output a droplet target into a chamber device, a prepulse laser light irradiation system configured to irradiate the droplet target with prepulse laser light having linear polarization to generate a diffusion target, and a main pulse laser light irradiation system configured to irradiate the diffusion target with main pulse laser light to generate extreme ultraviolet light. Here, a cross section perpendicular to an optical axis of the main pulse laser light when being radiated to the diffusion target has a shape longer in a polarization direction of the prepulse laser light when being radiated to the droplet target than in directions other than the polarization direction.

Further, an electronic device manufacturing method according to an aspect of the present disclosure includes outputting extreme ultraviolet light generated with an extreme ultraviolet light generation apparatus to an exposure apparatus, and exposing a photosensitive substrate to the extreme ultraviolet light in the exposure apparatus to manufacture an electronic device. Here, the extreme ultraviolet light generation apparatus includes a target supply unit configured to output a droplet target into a chamber device, a prepulse laser light irradiation system configured to irradiate the droplet target with prepulse laser light having linear polarization to generate a diffusion target, and a main pulse laser light irradiation system configured to irradiate the diffusion target with main pulse laser light to generate extreme ultraviolet light. Further, a cross section perpendicular to an optical axis of the main pulse laser light when being radiated to the diffusion target has a shape longer in a polarization direction of the prepulse laser light when being radiated to the droplet target than in directions other than the polarization direction.

Further, an electronic device manufacturing method according to another aspect of the present disclosure includes inspecting a defect of a mask by irradiating the mask with extreme ultraviolet light generated with an extreme ultraviolet light generation apparatus, selecting a mask using a result of the inspection, and exposing and transferring a pattern formed on the selected mask onto a photosensitive substrate. Here, the extreme ultraviolet light generation apparatus includes a target supply unit configured to output a droplet target into a chamber device, a prepulse laser light irradiation system configured to irradiate the droplet target with prepulse laser light having linear polarization to generate a diffusion target, and a main pulse laser light irradiation system configured to irradiate the diffusion target with main pulse laser light to generate extreme ultraviolet light. Further, a cross section perpendicular to an optical axis of the main pulse laser light when being radiated to the diffusion target has a shape longer in a polarization direction of the prepulse laser light when being radiated to the droplet target than in directions other than the polarization direction.

BRIEF DESCRIPTION OF THE DRAWINGS

Embodiments of the present disclosure will be described below merely as examples with reference to the accompanying drawings.

DESCRIPTION OF EMBODIMENTS

Figure 1:
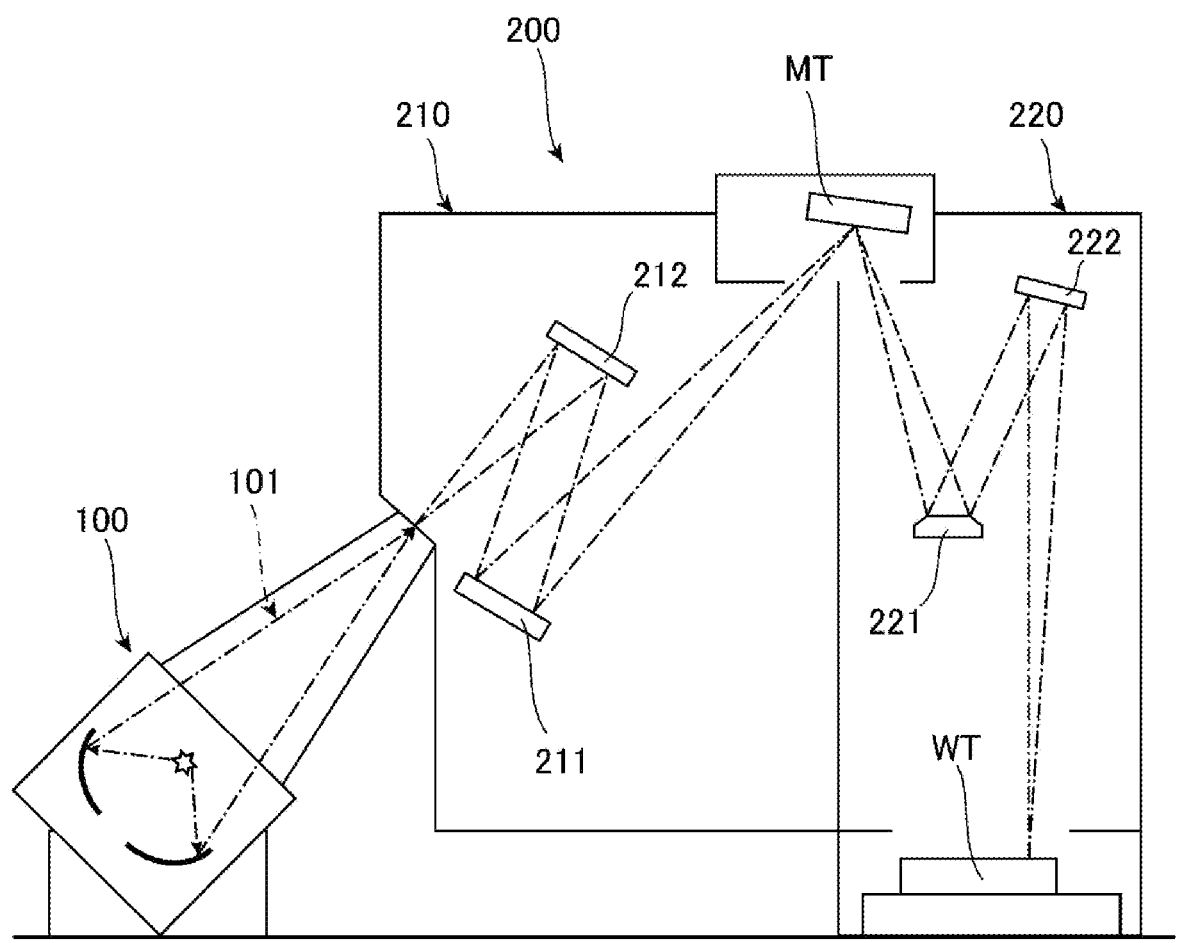
FIG. 1 is a schematic view showing a schematic configuration example of an entire electronic device manufacturing apparatus.

1. Overview
2. Description of electronic device manufacturing apparatus
3. Description of extreme ultraviolet light generation apparatus of comparative example
   3.1 Configuration
   3.2 Operation
   3.3 Problem
4. Description of extreme ultraviolet light generation apparatus of first embodiment
   4.1 Configuration
   4.2 Operation
   4.3 Effect
5. Description of extreme ultraviolet light generation apparatus of second embodiment
   5.1 Configuration
   5.2 Effect
6. Description of extreme ultraviolet light generation apparatus of third embodiment
   6.1 Configuration
   6.2 Effect Hereinafter, embodiments of the present disclosure will be described in detail with reference to the drawings.

The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overview

Embodiments of the present disclosure relate to an extreme ultraviolet light generation apparatus generating light having a wavelength of extreme ultraviolet (EUV) and an electronic device manufacturing apparatus. In the following, extreme ultraviolet light is referred to as EUV light in some cases.

2. Description of Electronic Device Manufacturing Apparatus

FIG. 1 is a schematic view showing a schematic configuration example of an entire electronic device manufacturing apparatus. The electronic device manufacturing apparatus shown in FIG. 1 includes an EUV light generation apparatus 100 and an exposure apparatus 200. The exposure apparatus 200 includes a mask irradiation unit 210 including a plurality of mirrors 211, 212 that constitute a reflection optical system, and a workpiece irradiation unit 220 including a plurality of mirrors 221, 222 that constitute a reflection optical system different from the reflection optical system of the mask irradiation unit 210. The mask irradiation unit 210 illuminates, via the mirrors 211, 212, a mask pattern of the mask table MT with EUV light 101 incident from the EUV light generation apparatus 100. The workpiece irradiation unit 220 images the EUV light 101 reflected by the mask table MT onto a workpiece (not shown) arranged on a workpiece table WT via the mirrors 211, 212. The workpiece is a photosensitive substrate such as a semiconductor wafer on which photoresist is applied. The exposure apparatus 200 synchronously translates the mask table MT and the workpiece table WT to expose the workpiece to the EUV light 101 reflecting the mask pattern. Through the exposure process as described above, a device pattern is transferred onto the semiconductor wafer, thereby a semiconductor device can be manufactured.

Figure 2:
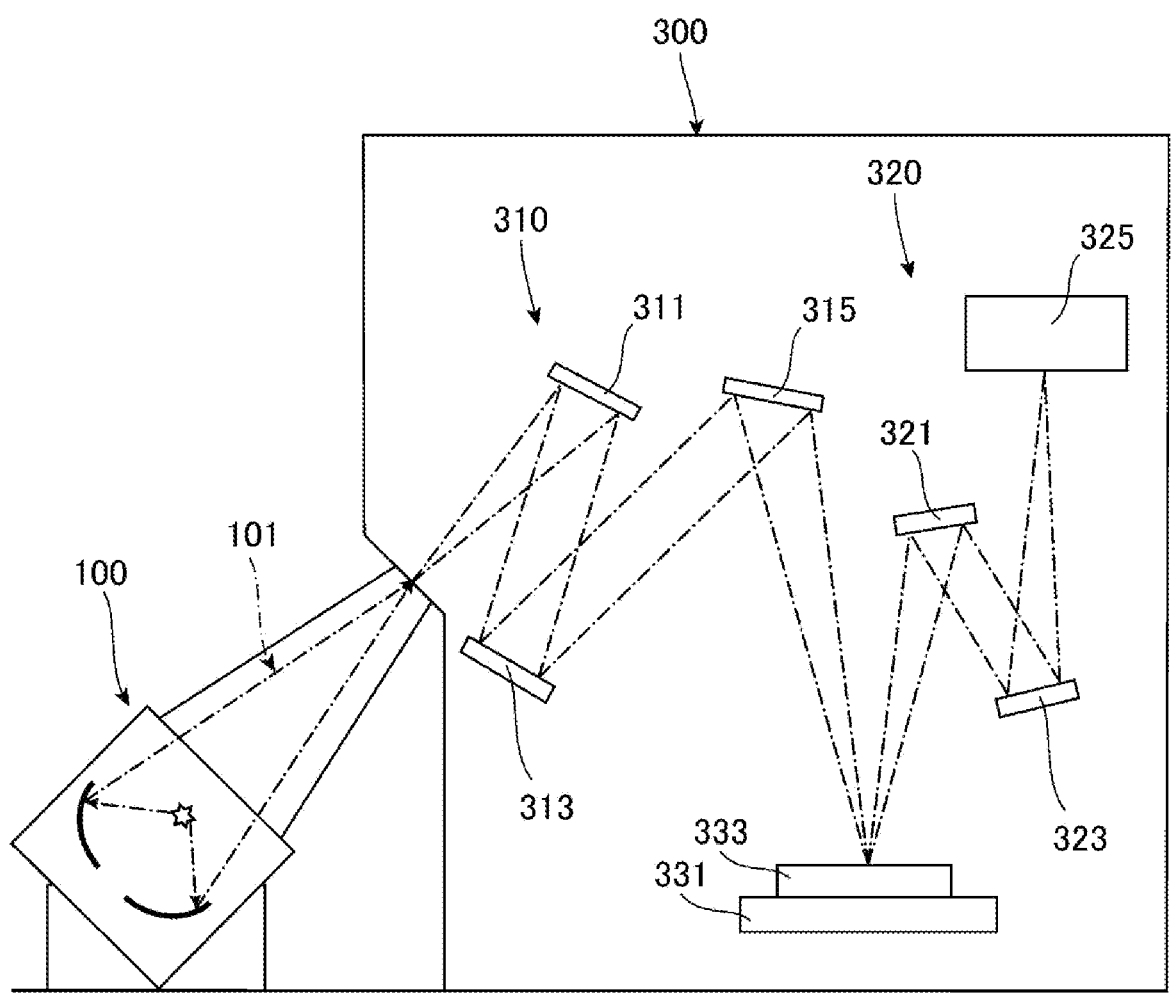
FIG. 2 is a schematic view showing a schematic configuration example of an entire electronic device manufacturing apparatus different from the electronic device manufacturing apparatus shown in FIG. 1.

FIG. 2 is a schematic view showing a schematic configuration example of an entire electronic device manufacturing apparatus different from the electronic device manufacturing apparatus shown in FIG. 1. The electronic device manufacturing apparatus shown in FIG. 2 includes the EUV light generation apparatus 100 and an inspection apparatus 300. The inspection apparatus 300 includes an illumination optical system 310 including a plurality of mirrors 311, 313, 315 that constitute a reflection optical system, and a detection optical system 320 including a plurality of mirrors 321, 322 that constitute a reflection optical system different from the reflection optical system of the illumination optical system 310 and a detector 325. The illumination optical system 310 reflects, with the mirrors 311, 313, 315, the EUV light 101 incident from the EUV light generation apparatus 100 to illuminate a mask 333 placed on a mask stage 331. The mask 333 includes a mask blanks before a pattern is formed. The detection optical system 320 reflects, with the mirrors 321, 323, the EUV light 101 reflecting the pattern from the mask 333 and forms an image on a light receiving surface of the detector 325. The detector 325 having received the EUV light 101 obtains an image of the mask 333. The detector 325 is, for example, a time delay integration (TDI) camera. A defect of the mask 333 is inspected based on the image of the mask 333 obtained by the above-described process, and a mask suitable for manufacturing an electronic device is selected using the inspection result. Then, the electronic device can be manufactured by exposing and transferring the pattern formed on the selected mask onto the photosensitive substrate using the exposure apparatus 200.

3. Description of Extreme Ultraviolet Light Generation Apparatus of Comparative Example 3.1 Configuration The EUV light generation apparatus 100 of a comparative example will be described. The comparative example of the present disclosure is an example recognized by the applicant as known only by the applicant, and is not a publicly known example admitted by the applicant. Further, the following description will be given with reference to the EUV light generation apparatus 100 that outputs the EUV light 101 to the exposure apparatus 200 as an external apparatus as shown in FIG. 1. Here, the EUV light generation apparatus 100 that outputs the EUV light 101 to the inspection apparatus 300 as an external apparatus as shown in FIG. 2 can obtain the same operation and effect.

Figure 3:
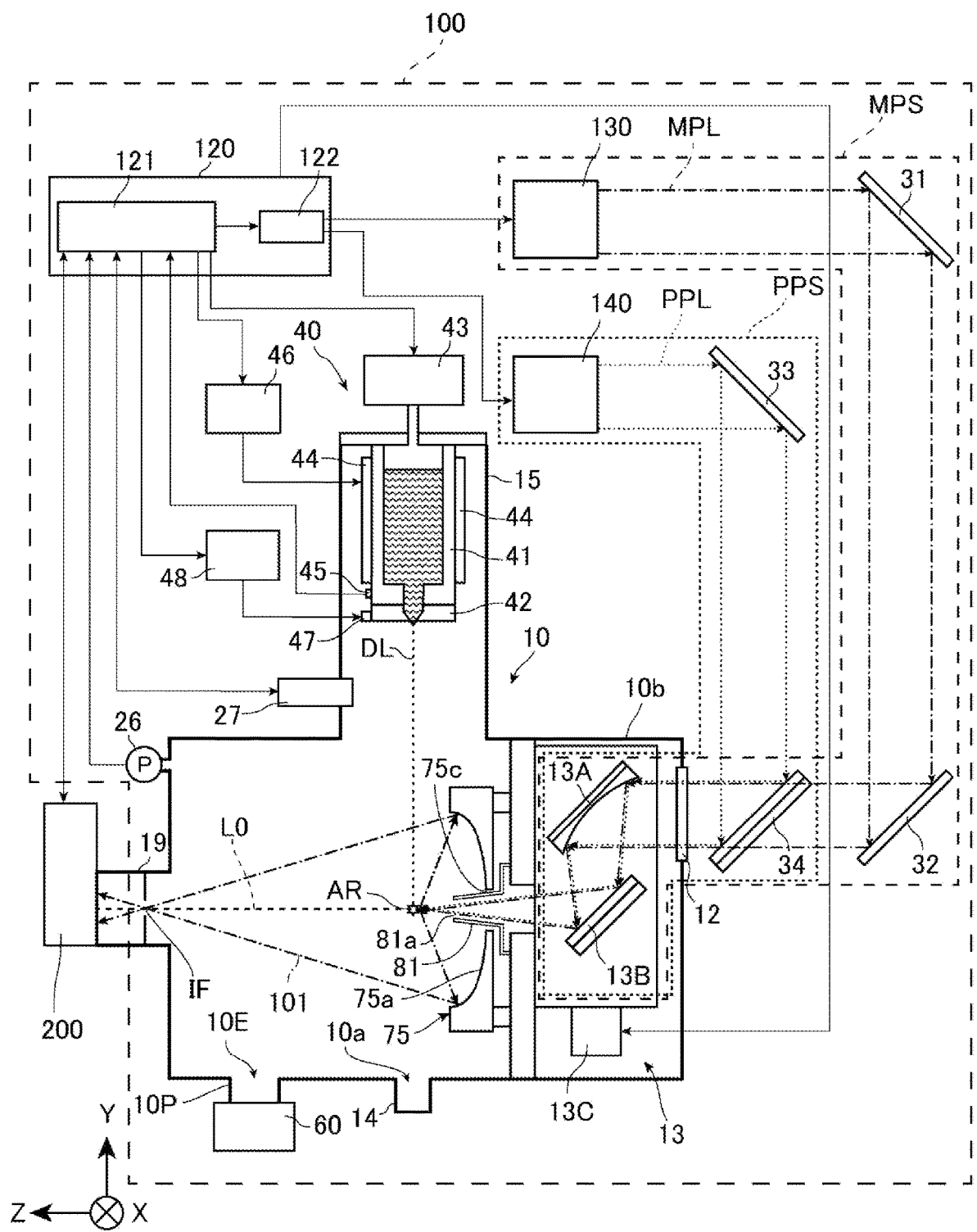
FIG. 3 is a schematic view showing a schematic configuration example of an entire extreme ultraviolet light generation apparatus of a comparative example.

FIG. 3 is a schematic view showing a schematic configuration example of the entire EUV light generation apparatus 100 of the present example. As shown in FIG. 3, the EUV light generation apparatus 100 mainly includes a chamber device 10, a main pulse laser light irradiation system MPS including a main pulse laser device 130, a prepulse laser light irradiation system PPS including a prepulse laser device 140, and a control system 120.

The chamber device 10 is a sealable container. The chamber device 10 includes an inner wall 10b surrounding the internal space having a low pressure atmosphere. The chamber device 10 also includes a sub-chamber 15. A target supply unit 40 is attached to the sub-chamber 15 to penetrate a wall of the sub-chamber 15. The target supply unit 40 includes a tank 41, a nozzle 42, and a pressure regulator 43 to supply a droplet target DL to the internal space of the chamber device 10. A droplet target DL is sometimes abbreviated as a droplet or a target.

The tank 41 stores therein a target substance which becomes the droplet target DL. The target substance contains tin. The inside of the tank 41 is in communication with the pressure regulator 43 which regulates the pressure in the tank 41. A heater 44 and a temperature sensor 45 are attached to the tank 41. The heater 44 heats the tank 41 with current applied from a heater power source 46. Through the heating, the target substance in the tank 41 melts. The temperature sensor 45 measures, via the tank 41, the temperature of the target substance in the tank 41. The pressure regulator 43, the temperature sensor 45, and the heater power source 46 are electrically connected to a processor 121 included in the control system 120.

The nozzle 42 is attached to the tank 41 and outputs the target substance. A piezoelectric element 47 is attached to the nozzle 42. The piezoelectric element 47 is electrically connected to a piezoelectric power source 48 and is driven by voltage applied from the piezoelectric power source 48. The piezoelectric power source 48 is electrically connected to the processor 121. The target substance output from the nozzle 42 is formed into the droplet target DL through operation of the piezoelectric element 47.

The chamber device 10 includes a target collection unit 14. The target collection unit 14 is a box body attached to an inner wall 10b of the chamber device 10 and communicates with the internal space of the chamber device 10 via an opening 10a formed at the inner wall 10b of the chamber device 10. The opening 10a is arranged directly below the nozzle 42. The target collection unit 14 is a drain tank to collect any unnecessary droplet target DL having passed through the opening 10a and reaching the target collection unit 14.

At least one through hole is formed in the inner wall 10b of the chamber device 10. The through hole is blocked by a window 12 through which pulse laser light output from the main pulse laser device 130 and the prepulse laser device 140 passes.

Further, a laser light concentrating optical system 13 is arranged at the internal space of the chamber device 10. The laser light concentrating optical system 13 includes a laser light concentrating mirror 13A and a high reflection mirror 13B. The laser light concentrating mirror 13A reflects and concentrates the laser light having passed through the window 12. The high reflection mirror 13B reflects light concentrated by the laser light concentrating mirror 13A. Positions of the laser light concentrating mirror 13A and the high reflection mirror 13B are adjusted by a laser light manipulator 13C so that a light concentration position of the laser light at the internal space of the chamber device 10 coincides with a position specified by the processor 121. The light concentration position is adjusted to be a position directly below the nozzle 42, and when the target substance is irradiated with the laser light at the light concentration position, plasma is generated by the irradiation, and the EUV light 101 is radiated from the plasma. The region in which plasma is generated is sometimes referred to as a plasma generation region AR.

For example, an EUV light concentrating mirror 75 having a spheroidal reflection surface 75a is arranged at the internal space of the chamber device 10. The reflection surface 75a reflects the EUV light 101 radiated from the plasma in the plasma generation region AR. The reflection surface 75a has a first focal point and a second focal point. The reflection surface 75a may be arranged such that, for example, the first focal point is located in the plasma generation region AR and the second focal point is located at an intermediate focal point IF. In FIG. 3, a straight line passing through the first focal point and the second focal point is shown as a focal line L0. In the following, the direction in which the focal line L0 extends may be referred to as the Z direction, the direction which is the discharge direction of the droplet target DL and is orthogonal to the Z direction may be referred to as the Y direction, and the direction orthogonal to the Z direction and the Y direction may be referred to as the X direction.

Further, the EUV light generation apparatus 100 includes a connection portion 19 providing communication between the internal space of the chamber device 10 and the internal space of the exposure apparatus 200. A wall in which an aperture is formed is arranged inside the connection portion 19. The wall is preferably arranged such that the aperture is located at the second focal point. The connection portion 19 is an outlet port of the EUV light 101 in the EUV light generation apparatus 100, and the EUV light 101 is output from the connection portion 19 and enters the exposure apparatus 200.

Further, the EUV light generation apparatus 100 includes a pressure sensor 26 and a target sensor 27. The pressure sensor 26 and the target sensor 27 are attached to the chamber device 10 and are electrically connected to the processor 121. The pressure sensor 26 measures the pressure at the internal space of the chamber device 10 and outputs a signal indicating the pressure to the processor 121. The target sensor 27 has, for example, an imaging function, and detects the presence, trajectory, position, velocity, and the like of the droplet target DL output from the nozzle hole of the nozzle 42 in accordance with an instruction from the processor 121. The target sensor 27 may be arranged inside the chamber device 10, or may be arranged outside the chamber device 10 and detect the droplet target DL through a window (not shown) arranged on a wall of the chamber device 10. The target sensor 27 includes a light receiving optical system (not shown) and an imaging unit (not shown) such as a charge-coupled device (CCD) or a photodiode. In order to improve the detection accuracy of the droplet target DL, the light receiving optical system forms an image of the trajectory of the droplet target DL and the periphery thereof on a light receiving surface of the imaging unit. When the droplet target DL passes through a light concentration region of a light source unit (not shown) arranged to improve contrast in the field of view of the target sensor 27, the imaging unit detects a change of the light passing through the trajectory of the droplet target DL and the periphery thereof. The imaging unit converts the detected light change into an electric signal as a signal related to the image data of the droplet target DL. The imaging unit outputs the electric signal to the processor 121.

The main pulse laser device 130 is configured by, for example, a YAG laser device or a $CO_2$ laser device, includes a master oscillator that performs burst operation, and outputs main pulse laser light MPL. In the burst operation, the main pulse laser light MPL is continuously output at a predetermined repetition frequency in a burst-on duration and the output of the main pulse laser light MPL is stopped in a burst-off duration.

The prepulse laser device 140 outputs prepulse laser light PPL linearly polarized in a predetermined direction. In the example of FIG. 3, the wavelength of the prepulse laser light PPL is different from the wavelength of the main pulse laser light MPL. Therefore, for example, when the main pulse laser device 130 is a YAG laser device, the prepulse laser device 140 is, for example, a $CO_2$ laser device. Here, the prepulse laser light PPL and the main pulse laser light MPL may have the same wavelength. In this case, the main pulse laser device 130 and the prepulse laser device 140 are, for example, both YAG laser devices or both $CO_2$ laser devices. The prepulse laser device 140 is configured to output the prepulse laser light PPL at the timing different from the timing at which the main pulse laser light MPL is output from the main pulse laser device 130. This control is performed by the control system 120 described below.

Travel directions of the main pulse laser light MPL and the prepulse laser light PPL are adjusted by a laser light delivery optical system including a plurality of mirrors. The laser light delivery optical system for adjusting the travel direction of the main pulse laser light MPL includes mirrors 31, 32. The laser light delivery optical system for adjusting the travel direction of the prepulse laser light PPL includes a mirror 33 and an optical path combining member 34. The optical path combining member 34 is arranged at a position where the optical path of the prepulse laser light PPL intersects with the optical path of the main pulse laser light MPL. In the present example, the optical path combining member 34 arranged as described above is a dichroic mirror that reflects the prepulse laser light PPL and transmits the main pulse laser light MPL to substantially overlap the optical path of the main pulse laser light MPL with the optical path of the prepulse laser light PPL. The orientation of at least one of the mirrors 31, 32, 33 and the optical path combining member 34 is adjusted by an actuator (not shown), and according to this adjustment, the main pulse laser light MPL and the prepulse laser light PPL can be appropriately propagated through the window 12 to the internal space of the chamber device 10. Here, when the prepulse laser light PPL and the main pulse laser light MPL have the same wavelength and have polarization directions different from each other by 90°, the optical path combining member 34 may be a polarizer.

The main pulse laser light irradiation system MPS is a system for irradiating a target substance with the main pulse laser light MPL. Therefore, in the present example, the main pulse laser light irradiation system MPS includes the mirrors 31, 32, the optical path combining member 34, and the laser light concentrating optical system 13, in addition to the main pulse laser device 130. Further, the prepulse laser light irradiation system PPS is a system for irradiating a target substance with the prepulse laser light PPL. Therefore, in the present example, the prepulse laser light irradiation system PPS includes the mirror 33, the optical path combining member 34, and the laser light concentrating optical system 13 in addition to the prepulse laser device 140.

The processor 121 of the control system 120 of the present disclosure is a processing device including a storage device in which a control program is stored and a central processing unit (CPU) that executes the control program. The processor 121 is specifically configured or programmed to perform various processes included in the present disclosure and controls the entire EUV light generation apparatus 100. The processor 121 receives a signal related to the pressure at the internal space of the chamber device 10, which is measured by the pressure sensor 26, a signal related to image data of the droplet target DL captured by the target sensor 27, a burst signal instructing the burst operation from the exposure apparatus 200, and the like. The processor 121 processes the various signals, and may control, for example, the timing at which the droplet target DL is output, the output direction of the droplet target DL, and the like. Further, the processor 121 may control output timings of the main pulse laser device 130 and the prepulse laser device 140, the travel directions and the light concentration positions of the main pulse laser light MPL and the prepulse laser light PPL, and the like. Such various kinds of control described above are merely exemplary, and other control may be added as necessary, as described later.

The processor 121 of the present example is electrically connected to the main pulse laser device 130 and the prepulse laser device 140 via a delay circuit 122 of the control system 120. The delay circuit 122 slightly changes the trigger signals for the main pulse laser device 130 and the prepulse laser device 140 output from the processor 121. Specifically, the trigger signals input to the main pulse laser device 130 and the prepulse laser device 140 are shifted so that the irradiation timing of the main pulse laser device 130 is set later than the irradiation timing of the prepulse laser device 140.

A central gas supply unit 81 for supplying etching gas to the internal space of the chamber device 10 is arranged at the chamber device 10. As described above, since the target substance contains tin, the etching gas is, for example, hydrogen-containing gas having hydrogen gas concentration of 100% in effect. Alternatively, the etching gas may be, for example, balance gas having hydrogen gas concentration of approximately 3%. The balance gas contains nitrogen ($N_2$) gas and argon (Ar) gas. Tin fine particles and tin charged particles are generated when the target substance constituting the droplet target DL is turned into plasma in the plasma generation region AR by being irradiated with the main pulse laser light MPL. Tin constituting these fine particles and charged particles reacts with hydrogen contained in the etching gas supplied to the internal space of the chamber device 10. Through the reaction with hydrogen, tin becomes stannane ($SnH_4$) gas at room temperature.

The central gas supply unit 81 has a side surface shape of a circular truncated cone, and is inserted through a through hole 75c formed in the center of the EUV light concentrating mirror 75. The central gas supply unit 81 is called a cone in some cases. Further, the central gas supply unit 81 has a central gas supply port 81a being a nozzle. The central gas supply port 81a is provided on the focal line L0 passing through the first focal point and the second focal point of the reflection surface 75a. The focal line L0 is extended along the center axis direction of the reflection surface 75a. The central gas supply port 81a supplies the etching gas from the center side of the reflection surface 75a toward the plasma generation region AR. Here, it is preferable that the etching gas is supplied from the central gas supply port 81a along the focal line L0 in the direction away from the reflection surface 75a from the center side of the reflection surface 75a. The central gas supply port 81a is connected to a gas supply device (not shown) being a tank through a pipe (not shown) of the central gas supply unit 81 and the etching gas is supplied therefrom. The gas supply device is driven and controlled by the processor 121. A supply gas flow rate adjusting unit being a valve (not shown) may be arranged in the pipe (not shown).

The central gas supply port 81a is a gas supply port for supplying the etching gas to the internal space of the chamber device 10 as well as an outlet port through which the prepulse laser light PPL and the main pulse laser light MPL are output to the internal space of the chamber device 10. The prepulse laser light PPL and the main pulse laser light MPL travel toward the internal space of the chamber device 10 through the window 12 and the central gas supply port 81a.

An exhaust port 10E is arranged at the inner wall 10b of the chamber device 10. Since the exposure apparatus 200 is arranged on the focal line L0, the exhaust port 10E is arranged at the inner wall 10b on the side lateral to the focal line L0. The direction along the center axis of the exhaust port 10E is, for example, perpendicular to the focal line L0. The exhaust port 10E is arranged on the side opposite to the reflection surface 75a with respect to the plasma generation region AR when viewed from the direction perpendicular to the focal line L0. The exhaust port 10E exhausts gas at the internal space of the chamber device 10. The exhaust port 10E is connected to an exhaust pipe 10P, and the exhaust pipe 10P is connected to an exhaust pump 60.

As described above, when the target substance is turned into plasma in the plasma generation region AR, the residual gas as exhaust gas is generated at the internal space of the chamber device 10. The residual gas contains tin fine particles and tin charged particles generated through the plasma generation from the target substance, stannane generated through the reaction of the tin fine particles and tin charged particles with the etching gas, and unreacted etching gas. Some of the charged particles are neutralized at the internal space of the chamber device 10, and the residual gas contains the neutralized charged particles as well. The residual gas is suctioned to the exhaust pump 60 through the exhaust port 10E and the exhaust pipe 10P.

3.2 Operation

Next, operation of the EUV light generation apparatus 100 of the comparative example will be described.

In the EUV light generation apparatus 100, for example, at the time of new installation or maintenance or the like, atmospheric air at the internal space of the chamber device 10 is exhausted. At this time, purging and exhausting of the internal space of the chamber device 10 may be repeated for exhausting atmospheric components. For example, inert gas such as nitrogen or argon is preferably used for the purge gas. Thereafter, when the pressure at the internal space of the chamber device 10 becomes equal to or lower than a predetermined pressure, the processor 121 starts introduction of the etching gas from the gas supply device to the internal space of the chamber device 10 through the central gas supply unit 81. At this time, the processor 121 may control the supply gas flow rate adjusting unit (not shown) and the exhaust pump 60 so that the pressure at the internal space of the chamber device 10 is maintained at a predetermined pressure. Thereafter, the processor 121 waits until a predetermined time elapses from the start of introduction of the etching gas.

Further, the processor 121 causes the gas at the internal space of the chamber device 10 to be exhausted from the exhaust port 10E by the exhaust pump 60, and keeps the pressure at the internal space of the chamber device 10 substantially constant based on the signal of the pressure at the internal space of the chamber device 10 measured by the pressure sensor 26.

In order to heat and maintain the target substance in the tank 41 to and at a predetermined temperature equal to or higher than the melting point, the processor 121 causes the heater power source 46 to supply current to the heater 44 to increase temperature of the heater 44. In this case, the processor 121 controls the temperature of the target substance to the predetermined temperature by adjusting a value of the current supplied from the heater power source 46 to the heater 44 based on an output from the temperature sensor 45. When the target substance is tin, the predetermined temperature is equal to or higher than 231.93° C. being the melting point of tin and, for example, is 240° C. or higher and 290° C. or lower. Thus, the preparation for outputting the droplet target DL is completed.

When the preparation is completed, the processor 121 causes the pressure regulator 43 to supply the inert gas from the gas supply source to the tank 41 and to adjust the pressure in the tank 41 so that the melted target substance is output through the nozzle hole of the nozzle 42 at a predetermined velocity. Under this pressure, the target substance is output into the chamber device 10 through the nozzle hole of the nozzle 42. The target substance output through the nozzle hole may be in the form of a jet. At this time, the processor 121 causes the piezoelectric power source 48 to apply voltage having a predetermined waveform to the piezoelectric element 47 to generate the droplet target DL. The piezoelectric power source 48 applies voltage so that the waveform of the voltage value becomes, for example, a sine wave, a rectangular wave, or a sawtooth wave. Vibration of the piezoelectric element 47 can propagate through the nozzle 42 to the target substance to be output through the nozzle hole of the nozzle 42. The target substance is divided at a predetermined cycle by the vibration into liquid droplet targets DL. The diameter of the droplet target DL is approximately 20 μm or less.

When the droplet target DL is output, the target sensor 27 detects the passage timing of the droplet target DL passing through a predetermined position at the internal space of the chamber device 10. The processor 121 outputs the trigger signal to control the timing of outputting the prepulse laser light PPL from the prepulse laser device 140 based on the signal from the target sensor 27 so that the droplet target DL is irradiated with the prepulse laser light PPL. The trigger signal output from the processor 121 is input to the prepulse laser device 140 and the main pulse laser device 130 via the delay circuit 122. Here, the delay circuit 122 outputs the trigger signal to the prepulse laser device 140 prior to the main pulse laser device 130. The prepulse laser device 140 outputs the prepulse laser light PPL when the trigger signal is input. At the timing when the prepulse laser light PPL is output, the main pulse laser light MPL is not output.

The prepulse laser light PPL is a picosecond pulse laser light having a temporal pulse width of, for example, 10 ps or more and 100 ps or less, or a nanosecond pulse laser light having a pulse width of, for example, 10 ns or more and 300 ns or less. Here, the above pulse width is an interval between times when the intensity of the laser light becomes a half value of the maximum value before and after the intensity becomes the maximum value. The picosecond pulse laser light and the nanosecond pulse laser light have substantially the same energy per pulse. Therefore, the picosecond pulse laser light has a higher energy density than the nanosecond pulse laser light. Here, the fluence of the prepulse laser light PPL is, for example, 0.1 J/cm$^2$ or more and 100 J/cm$^2$ or less. Preferably, the fluence is equal to or larger than to 1 J/cm$^2$ and equal to or smaller than 20 J/cm$^2$ for picosecond pulse laser light and equal to or larger than 1 J/cm$^2$ and equal to or smaller than 3 J/cm$^2$ for nanosecond pulse laser light. The prepulse laser light PPL having linear polarization and output from the prepulse laser device 140 is reflected by the mirror 33 and the optical path combining member 34, and is radiated to the droplet target DL via the laser light concentrating optical system 13. At this time, the processor 121 controls the laser light manipulator 13C of the laser light concentrating optical system 13 so that the prepulse laser light PPL is concentrated in the vicinity of the plasma generation region AR. The droplet target DL irradiated with the prepulse laser light PPL is diffused by laser ablation due to the energy of the laser light, and becomes a diffusion target. Therefore, the prepulse laser light irradiation system PPS is a system for generating a diffusion target by irradiating the droplet target DL with the prepulse laser light PPL.

Since the diffusion target is a target in which the droplet target DL is diffused, the diameter thereof is larger than that of the droplet target DL, and the density thereof is lower than that of the droplet target DL.

When the trigger signal is input to the main pulse laser device 130 with a delay from the timing at which the trigger signal is input to the prepulse laser device 140, the main pulse laser device 130 outputs the main pulse laser light MPL. The time difference between the output timing of the prepulse laser light PPL and the output timing of the main pulse laser light MPL is, for example, 50 ns or more and 500 ns or less in the case of the picosecond pulse laser light, and 50 ns or more and 150 ns or less in the case of the nanosecond pulse laser light. The processor 121 and the delay circuit 122 output the light emission trigger signal to control the timing at which the main pulse laser light MPL is output from the main pulse laser device 130 so that the diffusion target is irradiated with the main pulse laser light MPL.

The main pulse laser light MPL is laser light having a pulse width of, for example, 1 ns or more and 50 ns or less, more preferably of 15 ns or more and 20 ns or less. The main pulse laser light MPL output from the main pulse laser device 130 is reflected by the mirrors 31, 32, transmitted through the optical path combining member 34, and radiated to the diffusion target in the plasma generation region AR via the laser light concentrating optical system 13. At this time, the processor 121 controls the laser light manipulator 13C of the laser light concentrating optical system 13 so that the main pulse laser light MPL is concentrated in the plasma generation region AR. The diffusion target irradiated with the main pulse laser light MPL is turned into plasma due to the energy of the laser light, and light including EUV light is radiated from the plasma. Thus, the main pulse laser light irradiation system MPS is a system for generating EUV light by irradiating the diffusion target with the main pulse laser light MPL.

When the diffusion target in which the density of the target substance is lowered is irradiated with the main pulse laser light MPL as described above, a larger amount of the target substance may be turned into plasma and EUV light may be efficiently radiated, compared to a case in which the droplet target DL is directly irradiated with the main pulse laser light MPL.

Among the light including the EUV light generated in the plasma generation region AR, the EUV light 101 is concentrated at the intermediate focal point IF by the EUV light concentrating mirror 75, and then, is incident on the exposure apparatus 200 from the connection portion 19.

Here, when the target substance is turned into plasma, tin fine particles are generated as described above. The fine particles diffuse to the internal space of the chamber device 10. The fine particles diffusing to the internal space of the chamber device 10 react with the hydrogen-containing etching gas supplied from the central gas supply unit 81 to become stannane. Most of the stannane obtained through the reaction with the etching gas flows into the exhaust port 10E along with the flow of the unreacted etching gas. At least some of the unreacted charged particles, fine particles, and etching gas flow into the exhaust port 10E.

The unreacted etching gas, fine particles, charged particles, stannane, and the like having flowed into the exhaust port 10E flow as residual gas through the exhaust pipe 10P into the exhaust pump 60 and are subjected to predetermined exhaust treatment such as detoxification.

3.3 Problem

Figure 4:
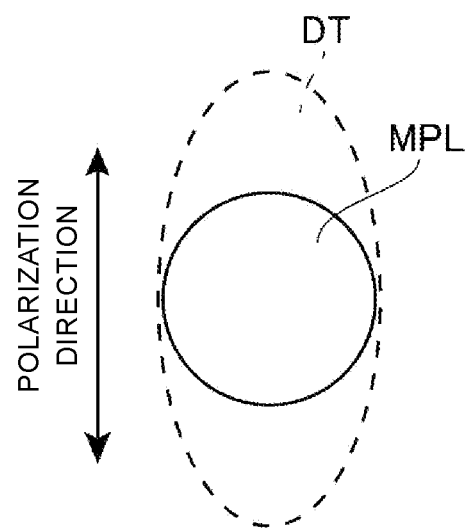
FIG. 4 is a diagram showing an example of the relationship between cross sections of a diffusion target and main pulse laser light when being radiated to the diffusion target.
Figure 5:
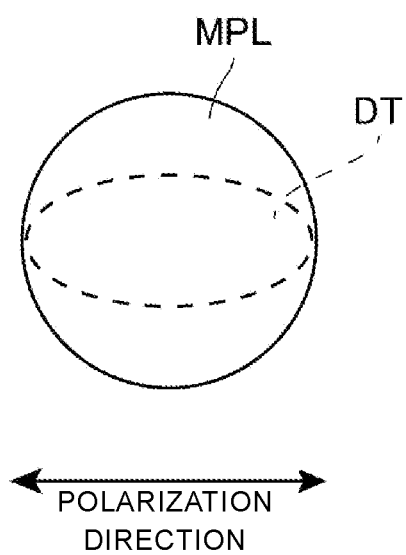
FIG. 5 is a diagram showing another example of the relationship between cross sections of the diffusion target and the main pulse laser light.

In the EUV light generation apparatus 100 of the comparative example, the prepulse laser device 140 outputs the prepulse laser light PPL having linear polarization. When the droplet target DL is irradiated with the prepulse laser light PPL having linear polarization, the diffusion target tends to spread in a shape longer in the polarization direction of the prepulse laser light PPL than in directions other than the polarization direction. In general, the cross section of the main pulse laser light MPL perpendicular to the optical axis thereof has a circular shape. FIG. 4 is a diagram showing an example of the relationship between cross sections of the diffusion target DT and the main pulse laser light MPL when being radiated to the diffusion target DT. FIG. 5 is a diagram showing another example of the relationship between cross sections of the diffusion target DT and the main pulse laser light MPL when being radiated to the diffusion target DT. In FIGS. 4 and 5, the diffusion target DT is shown by a broken line for ease of viewing. As shown in FIG. 4, when the diameter of the cross section of the main pulse laser light MPL is smaller than the length of the cross section of the diffusion target DT in the longitudinal direction, a part of the diffusion target DT is not irradiated with the main pulse laser light MPL. Therefore, it becomes difficult for a part of the target substance to turn into plasma, and the unreacted target substance which is not turned into plasma is discharged from the exhaust pipe 10P or becomes debris and adheres to the inner wall 10b of the chamber device 10 or the reflection surface 75a of the EUV light concentrating mirror 75. On the other hand, as shown in FIG. 5, when the diameter of the cross section of the main pulse laser light MPL is larger than the length of the cross section of the diffusion target DT in the longitudinal direction, the cross section of the main pulse laser light MPL is larger than that of the diffusion target DT. Therefore, a part of the main pulse laser light MPL is not radiated to the diffusion target DT, so that loss occurs in the main pulse laser light MPL. Therefore, there is a demand for efficient generation of EUV light.

Therefore, in the following embodiments, an EUV light generation apparatus capable of efficiently generating EUV light will be exemplified.

4. Description of Extreme Ultraviolet Light Generation Apparatus of First Embodiment Next, the configuration of the EUV light generation apparatus 100 of a first embodiment will be described. Any component same as that described above is denoted by an identical reference sign, and duplicate description thereof is omitted unless specific description is needed.

4.1 Configuration

Figure 6:
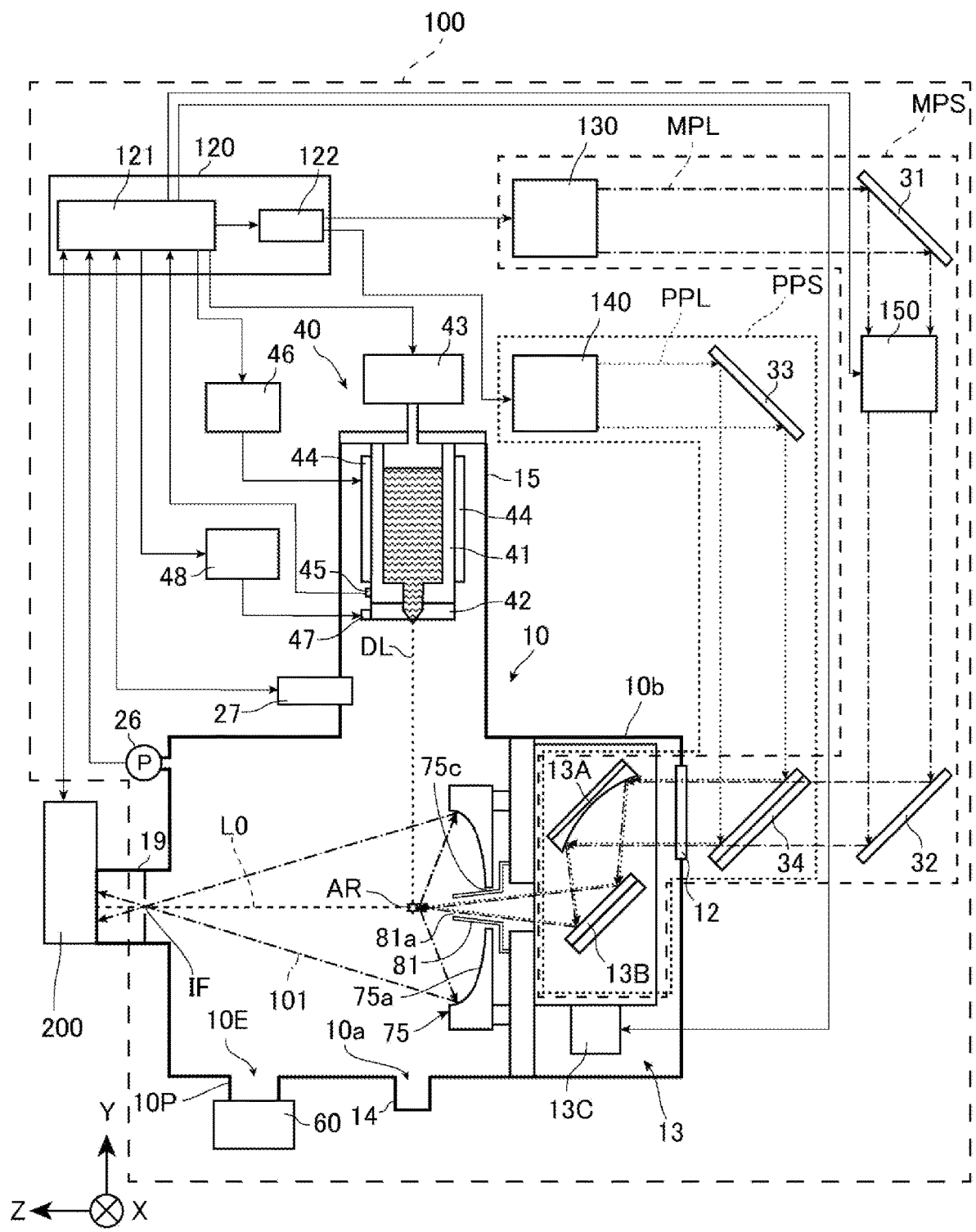
FIG. 6 is a schematic view showing a schematic configuration example of the entire extreme ultraviolet light generation apparatus of a first embodiment.

FIG. 6 is a schematic view showing a schematic configuration example of the entire EUV light generation apparatus 100 of the present embodiment. In the EUV light generation apparatus 100 of the present embodiment, the main pulse laser light irradiation system MPS differs from that of the comparative example in that a shaping unit 150 is included.

The shaping unit 150 is arranged on the upstream side of the optical path combining member 34 in the travel direction of the main pulse laser light MPL. FIG. 6 shows an example in which the shaping unit 150 is arranged between the mirror 31 and the mirror 32.

Figure 7:
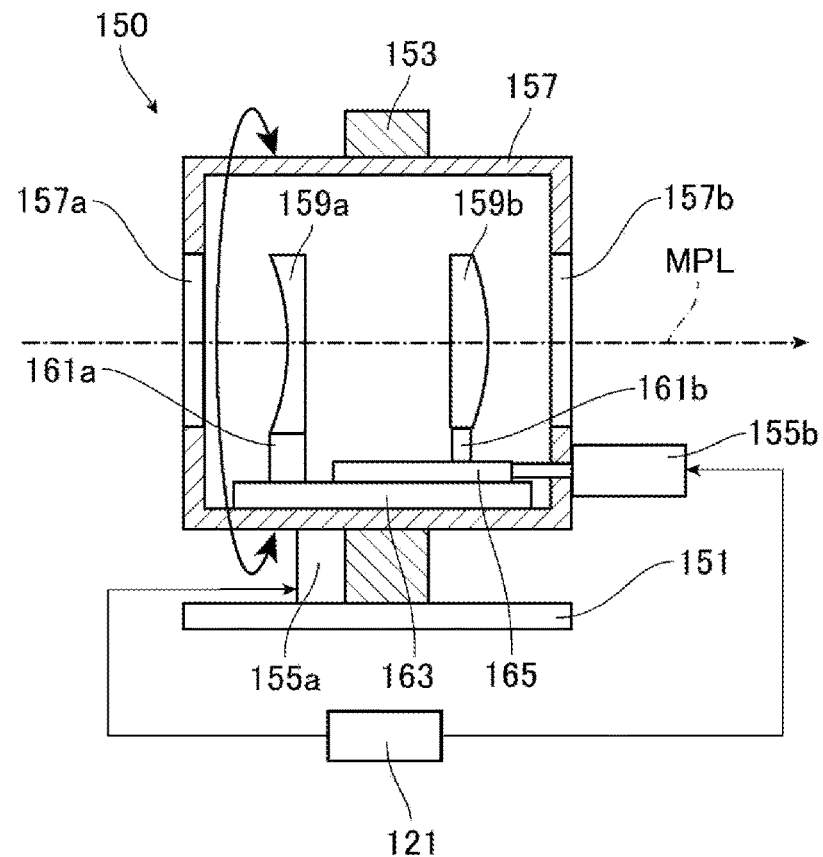
FIG. 7 is a partial sectional view showing a schematic configuration example of a shaping unit.

FIG. 7 is a partial sectional view showing a schematic configuration example of the shaping unit 150. Specifically, FIG. 7 is a partial sectional view of the shaping unit 150 taken along a plane including the optical axis of the main pulse laser light MPL. The shaping unit 150 includes a pedestal 151, a rotation stage 153, actuators 155a, 155b, a housing 157, a cylindrical concave lens 159a, a cylindrical convex lens 159b, holders 161a, 161b, a base member 163, and a stage 165. In FIG. 7, the rotation stage 153 and the housing 157 are shown in cross section.

An opening 157a serving as an entrance port of the main pulse laser light MPL and an opening 157b serving as an outlet port of the main pulse laser light MPL are provided at the sidewall of the housing 157. The base member 163 is arranged on the bottom wall of the housing 157, and the holder 161a for holding the cylindrical concave lens 159a and the stage 165 are arranged on the base member 163. The holder 161b for holding the cylindrical convex lens 159b is arranged on the stage 165.

The concave surface of the cylindrical concave lens 159a faces the opening 157a, and the cylindrical convex lens 159b is positioned between the cylindrical concave lens 159a and the opening 157b. Further, the convex surface of the cylindrical convex lens 159b faces the opening 157b, and the flat surface on the side opposite to the convex surface of the cylindrical convex lens 159b faces the flat surface on the side opposite to the concave surface of the cylindrical concave lens 159a. When the main pulse laser light MPL passes through the cylindrical concave lens 159a, the cross section of the main pulse laser light MPL perpendicular to the optical axis thereof expands in a predetermined direction. When the main pulse laser light MPL passes through the cylindrical convex lens 159b, the main pulse laser light MPL expanded in the predetermined direction is collimated.

The actuator 155b is attached to the outer wall of the housing 157, the shaft of the actuator 155b extends along the optical axis of the main pulse laser light MPL, and the tip of the shaft of the actuator 155b is connected to the side surface of the stage 165. The actuator 155b is electrically connected to the processor 121 and moves the shaft thereof along the optical axis of the main pulse laser light MPL in accordance with a control signal from the processor 121 to push and pull the stage 165. As a result, the cylindrical convex lens 159b is moved, and the distance between the cylindrical concave lens 159a and the cylindrical convex lens 159b is adjusted.

By adjusting the above distance, the shaping unit 150 shapes the cross section of the main pulse laser light MPL perpendicular to the optical axis thereof when being radiated to the diffusion target DT into a shape longer in the polarization direction of the prepulse laser light PPL than in directions other than the polarization direction, thereby adjusting the length of the cross section in the polarization direction. The cross section of such main pulse laser light MPL is an elliptical shape long in the polarization direction. The cross section refers to a cross section in a region where the intensity of the main pulse laser light MPL is equal to or larger than a half value of the maximum value of the intensity in the intensity distribution in the cross section of the main pulse laser light MPL.

The rotation stage 153 and the actuator 155a are arranged on the pedestal 151. The rotation stage 153 is cylindrical, and the housing 157 is supported at the inside of the rotation stage 153. The actuator 155a is connected to the rotation stage 153 and electrically connected to the processor 121, and rotates the rotation stage 153 about the optical axis of the main pulse laser light MPL passing through the housing 157 in accordance with a control signal from the processor 121. As a result, the cylindrical concave lens 159a and the cylindrical convex lens 159b inside the housing 157 rotate, and the cross section perpendicular to the optical axis of the main pulse laser light MPL when being radiated to the diffusion target DT also rotates about the optical axis.

The holder 161a may be arranged on the stage 165 instead of the holder 161b. Alternatively, the holders 161a, 161b may be individually arranged on different stages 165, and each stage 165 may be individually connected to the actuator 155b. The actuator 155b may move at least one of the cylindrical concave lens 159a and the cylindrical convex lens 159b along the optical axis of the main pulse laser light MPL to adjust the distance between the cylindrical concave lens 159a and the cylindrical convex lens 159b.

4.2 Operation

Next, operation of the EUV light generation apparatus 100 of the present embodiment will be described.

Figure 8:
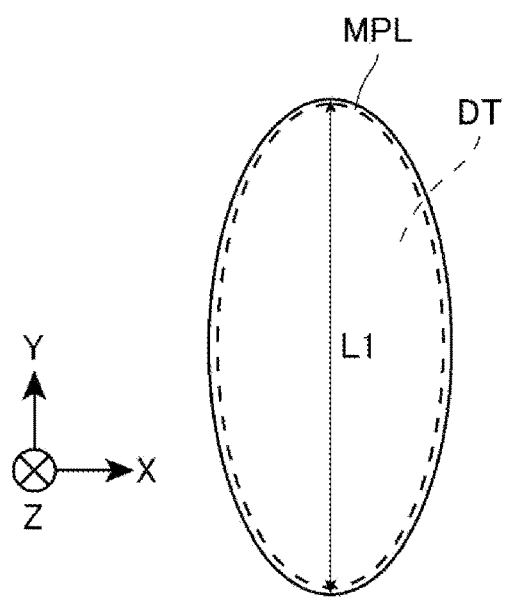
FIG. 8 is a diagram showing an example of the relationship between cross sections of the diffusion target and the main pulse laser light in the first embodiment.

Similarly to the comparative example, when the droplet target DL is output from the target supply unit 40, the prepulse laser device 140 outputs the prepulse laser light PPL having linear polarization. When the droplet target DL is irradiated with the prepulse laser light PPL, the diffusion target DT is generated. The diffusion target DT tends to spread in a shape longer in the polarization direction of the prepulse laser light PPL than in directions other than the polarization direction owing to the prepulse laser light PPL having linear polarization when being radiated to the droplet target DL. In the arrangement of FIG. 8 described below, for example, the XZ plane will be described as the incidence surface of the prepulse laser light PPL having linear polarization. Further, in the case that the prepulse laser light PPL at the time of being radiated to the droplet target DL has S polarization, the polarization direction of the prepulse laser light PPL is the Y direction. Further, in the case that the prepulse laser light PPL at the time of being radiated to the droplet target DL has P polarization, the polarization direction of the prepulse laser light PPL is the X direction.

FIG. 8 is a diagram showing an example of the relationship between cross sections of the diffusion target DT and the main pulse laser light MPL when being radiated to the diffusion target DT in the present embodiment. When the prepulse laser light PPL having S polarization is radiated to the droplet target DL, the diffusion target DT tends to spread in an elliptical shape long in the Y direction as shown by a broken line in FIG. 8. The cross section of the main pulse laser light MPL shown by a solid line in FIG. 8 will be described later. Here, when the prepulse laser light PPL having P polarization is radiated to the droplet target DL, the diffusion target DT tends to spread in an elliptical shape long in the X direction.

Next, the processor 121 of the present embodiment measures the length of the diffusion target DT in the longitudinal direction and the length of the diffusion target DT in a direction perpendicular to the longitudinal direction from the signal related to the shape of the diffusion target DT imaged by the target sensor 27. Then, the processor 121 controls the actuator 155b based on the measurement result to adjust the distance between the cylindrical concave lens 159a and the cylindrical convex lens 159b. Further, the processor 121 controls the actuator 155a based on the measurement result to rotate the housing 157 about the optical axis of the main pulse laser light MPL.

Next, similarly to the comparative example, the main pulse laser device 130 outputs the main pulse laser light MPL, and the main pulse laser light MPL passes through the cylindrical concave lens 159a and the cylindrical convex lens 159b of the shaping unit 150. Then, the main pulse laser light MPL is reflected by the mirror 32, passes through the optical path combining member 34 and the window 12, is reflected by the mirrors 13A, 13B, and is radiated to the diffusion target DT. The shaping unit 150 shapes the cross section of the main pulse laser light MPL perpendicular to the optical axis thereof when being radiated to the diffusion target DT into an elliptical shape longer in the polarization direction of the prepulse laser light PPL than in directions other than the polarization direction. By adjusting the distance described above, the length of the cross section of the main pulse laser light MPL in the longitudinal direction becomes close to the length of the diffusion target DT in the longitudinal direction. In FIG. 8, the length of the main pulse laser light MPL shown by a solid line is indicated by L1, and the main pulse laser light MPL is shown slightly larger than the diffusion target DT for ease of viewing. The length L1 is shortened when the distance is shortened, and is lengthened when the distance is lengthened. The processor 121 adjusts the distance so that the length L1 is 20 μm or more and 100 μm or less. Further, the cylindrical concave lens 159a and the cylindrical convex lens 159b are rotated by the rotation of the housing 157, so that the inclination of the major axis of the cross section of the main pulse laser light MPL with respect to the X direction when being radiated to the diffusion target DT is adjusted. With respect to the prepulse laser light PPL having S polarization when being radiated to the droplet target DL, the processor 121 causes the elliptical cross section of the main pulse laser light MPL to be elongated in the Y direction as shown in FIG. 8 by the rotation. Further, with respect to the prepulse laser light PPL having P polarization when being radiated to the droplet target DL, the processor 121 causes the elliptical cross section of the main pulse laser light MPL to be elongated in the X direction. By adjusting the distance and the inclination of the major axis, the deviation of the irradiation of the diffusion target DT with the main pulse laser light MPL is suppressed.

The diffusion target DT is irradiated with the main pulse laser light MPL in which the length L1 and the inclination of the major axis are adjusted, and the EUV light 101 is emitted from the diffusion target DT.

4.3 Effect

As described above, the cross section perpendicular to the optical axis of the main pulse laser light MPL when being radiated to the diffusion target DT in the present embodiment has a shape longer in the polarization direction of the prepulse laser light PPL when being radiated to the droplet target DL than in directions other than the polarization direction.

The prepulse laser light irradiation system PPS generates the diffusion target DT by irradiating the droplet target DL output from the target supply unit 40 into the chamber device 10 with the prepulse laser light PPL. The generated diffusion target DT tends to spread in a shape longer in the polarization direction of the prepulse laser light PPL when being radiated to the droplet target DL than in directions other than the polarization direction. In the above configuration, the cross section of the main pulse laser light MPL perpendicular to the optical axis thereof when being radiated to the diffusion target DT has a shape longer in the polarization direction of the prepulse laser light PPL than in directions other than the polarization direction. Therefore, compared to a case in which the cross section of the main pulse laser light MPL is circular and the diameter of the circle is smaller than the length of the diffusion target DT in the polarization direction of the prepulse laser light PPL, it can be suppressed that a part of the diffusion target DT is not irradiated with the main pulse laser light MPL. Therefore, the droplet target DL can be easily turned into plasma. Further, on the other hand, compared to a case in which the diameter of the circle is longer than the length of the diffusion target DT in the polarization direction of the prepulse laser light PPL, the loss of the main pulse laser light MPL can be suppressed. Therefore, according to the EUV light generation apparatus 100 of the present embodiment, the EUV light 101 can be efficiently generated.

The shaping unit 150 of the present embodiment includes the cylindrical concave lens 159a, the cylindrical convex lens 159b, and the actuator 155b which adjusts the distance between the cylindrical concave lens 159a and the cylindrical convex lens 159b. In the above configuration, by adjusting the distance between the cylindrical concave lens 159a and the cylindrical convex lens 159b by the actuator 155b, the length of the cross section of the main pulse laser light MPL in the longitudinal direction when being radiated to the diffusion target DT can be adjusted. Therefore, the main pulse laser light MPL having an appropriate cross section can be radiated to the diffusion target DT.

The processor 121 controls the adjustment of the distance between the cylindrical concave lens 159a and the cylindrical convex lens 159b by the actuator 155b. Therefore, compared to a case in which an operator of the EUV light generation apparatus 100 manually adjusts the distance between the cylindrical concave lens 159a and the cylindrical convex lens 159b, the burden on the operator for the adjustment can be reduced.

Further, the shaping unit 150 is arranged on the upstream side of the optical path combining member 34 with respect to the travel direction of the main pulse laser light MPL. According to the above configuration, only the main pulse laser light MPL travels to the shaping unit 150. Therefore, the shaping unit 150 can shape only the cross section of the main pulse laser light MPL when being radiated to the diffusion target DT to a shape longer in the polarization direction of the prepulse laser light PPL when being radiated to the droplet target DL than in directions other than the polarization direction.

In the EUV light generation apparatus 100 of the present embodiment, the main pulse laser light MPL and the prepulse laser light PPL have different wavelengths but the polarization directions thereof may be the same or different. In this case, the optical path combining member 34 is a dichroic mirror. Further, the main pulse laser light MPL and the prepulse laser light PPL may have the same wavelength and polarization directions different from each other by 90°. In this case, the optical path combining member 34 is a polarizer. Further, in this case, the main pulse laser device 130 and the prepulse laser device 140 are, for example, both YAG laser devices or both $CO_2$ laser devices. By matching the polarization direction of the polarizer to the polarization direction of the main pulse laser light MPL, the main pulse laser light MPL passes through the polarizer. Further, by setting the polarization direction of the polarizer different from the polarization direction of the prepulse laser light PPL, the polarizer reflects the prepulse laser light PPL.

5. Description of Extreme Ultraviolet Light Generation Apparatus of Second Embodiment Next, the configuration of the EUV light generation apparatus 100 of a second embodiment will be described. Any component same as that described above is denoted by an identical reference sign, and duplicate description thereof is omitted unless specific description is needed.

5.1 Configuration

Figure 9:
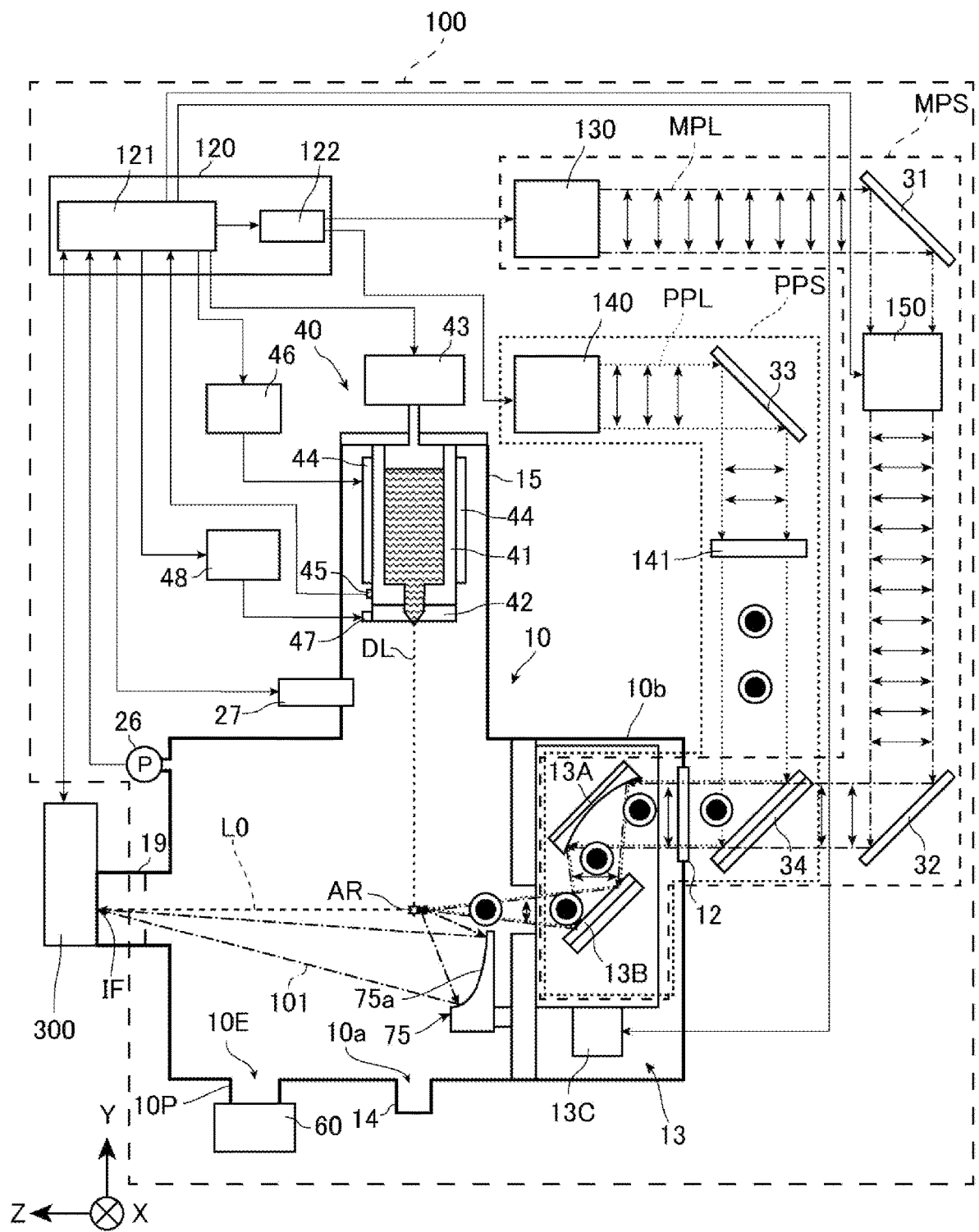
FIG. 9 is a schematic view showing a schematic configuration example of the entire extreme ultraviolet light generation apparatus of a second embodiment.
Figure 10:
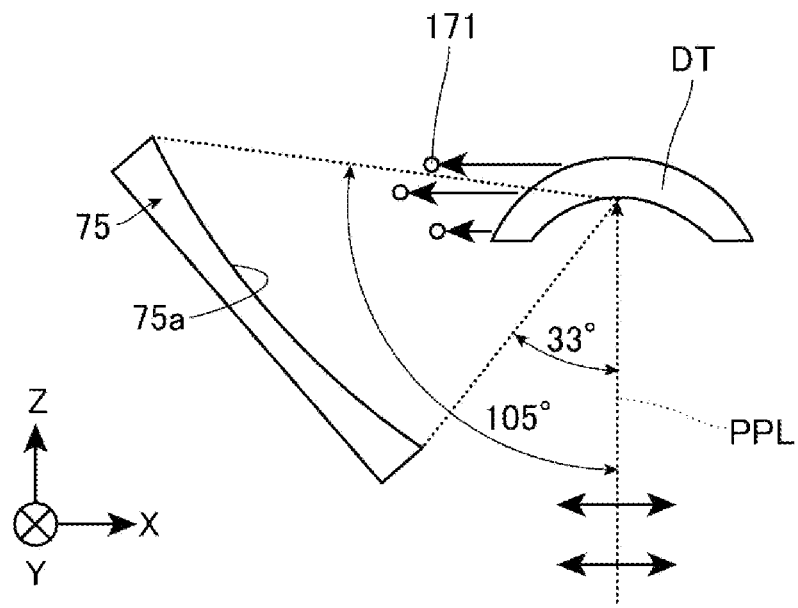
FIG. 10 is a view of the arrangement position of an EUV light concentrating mirror with respect to an optical axis of prepulse laser light when the diffusion target is generated viewed from the Y direction.

FIG. 9 is a schematic view showing a schematic configuration example of the entire EUV light generation apparatus 100 of the present embodiment. The EUV light generation apparatus 100 of the present embodiment is the EUV light generation apparatus 100 that outputs the EUV light 101 toward the inspection apparatus 300 instead of the exposure apparatus 200. In this case, in the EUV light generation apparatus 100 of the present embodiment, a collection solid angle of the EUV light concentrating mirror 75 for the EUV light 101 may be limited as compared with the EUV light generation apparatus 100 that outputs the EUV light 101 toward the exposure apparatus 200. Due to the limitation of the collection solid angle, the EUV light concentrating mirror 75 can be made smaller than that when used in the EUV light generation apparatus 100 that outputs the EUV light 101 toward the exposure apparatus 200. Therefore, in the EUV light generation apparatus 100 of the present embodiment, the EUV light concentrating mirror 75 is different from the EUV light concentrating mirror of the first embodiment in that the EUV light concentrating mirror 75 is arranged in a part of the circumference of the optical axis in the circumferential direction of the optical axis of the prepulse laser light PPL when being radiated on the droplet target DL rather than over the entire circumference of the optical axis. That is, the EUV light concentrating mirror 75 is arranged at a position laterally offset from the optical axis of the prepulse laser light PPL when being radiated to the droplet target DL. Further, the EUV light concentrating mirror 75 is different from the EUV light concentrating mirror 75 of the first embodiment in that the EUV light concentrating mirror 75 is arranged within a predetermined range on the lateral side of the optical axis. FIG. 10 is a view of the arrangement position of the EUV light concentrating mirror 75 with respect to the optical axis of the prepulse laser light PPL when the diffusion target DT is generated viewed from the Y direction. The predetermined range for the EUV light concentrating mirror 75 is a range within, for example, 33° or larger and 105° or smaller with respect to the optical axis of the prepulse laser light PPL when being radiated to the droplet target DL.

In the EUV light generation apparatus 100 of the present embodiment, the main pulse laser device 130 outputs the main pulse laser light MPL having polarization in the X direction, and the prepulse laser device 140 outputs prepulse laser light PPL having polarization in the X direction. Further, in the EUV light generation apparatus 100 of the present embodiment, the main pulse laser light MPL and the prepulse laser light PPL have the same wavelength. Therefore, the optical path combining member 34 is a polarizer.

Here, unlike the present embodiment, a case in which the diffusion target DT is generated by the prepulse laser light PPL having polarization in the X direction will be described. In this case, as shown in FIG. 10, the diffusion target DT tends to spread in the X direction which is the polarization direction of the prepulse laser light PPL when being radiated to the droplet target DL, and debris 171 generated from the diffusion target DT tends to scatter in the X direction. When the EUV light concentrating mirror 75 is arranged in the predetermined range, since the EUV light concentrating mirror 75 is located at the scattering destination of the debris 171, the debris 171 may scatter and adhere to the EUV light concentrating mirror 75.

Therefore, in the EUV light generation apparatus 100 of the present embodiment, the prepulse laser light irradiation system PPS is different from that of the first embodiment in that a λ/2 wavelength plate 141 is included as shown in FIG. 9. The λ/2 wavelength plate 141 is arranged on the upstream side of the optical path combining member 34 in the travel direction of the prepulse laser light PPL. FIG. 9 shows an example in which the λ/2 wavelength plate 141 is arranged between the mirror 33 and the optical path combining member 34.

Figure 11:
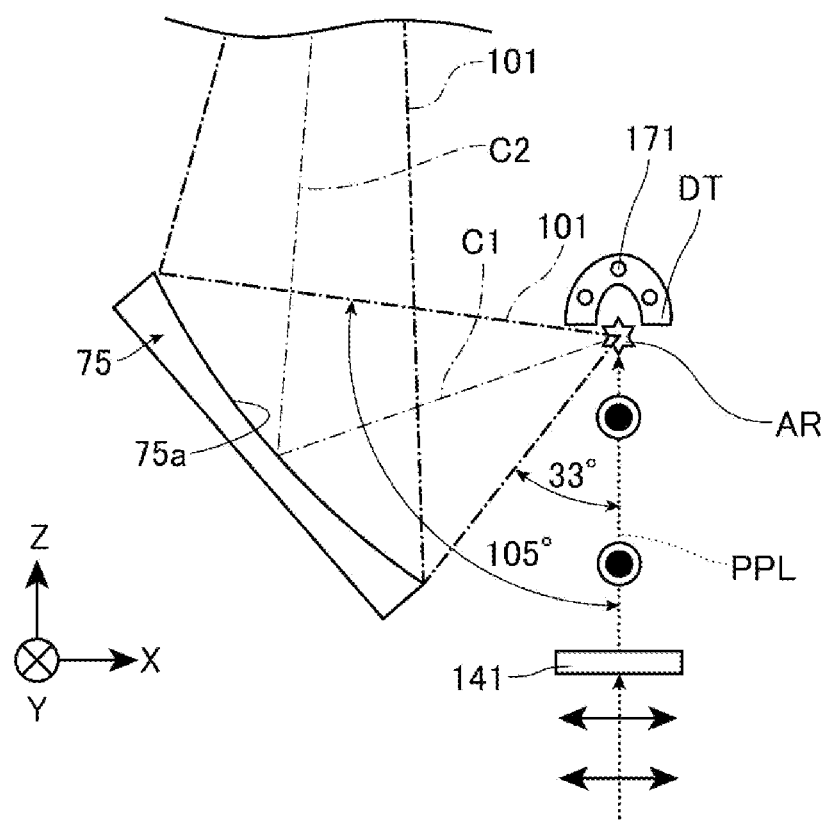
FIG. 11 is a view of the diffusion target generated by the prepulse laser light viewed from the Y direction.

FIG. 11 is a view of the diffusion target DT generated by the prepulse laser light PPL viewed from the Y direction. The λ/2 wavelength plate 141 changes the polarization direction of the prepulse laser light PPL when being radiated to the droplet target DL from the optical axis of the prepulse laser light PPL when being radiated to the droplet target DL to a direction different from the direction toward the EUV light concentrating mirror 75. The λ/2 wavelength plate 141 rotates the polarization direction of the prepulse laser light PPL having polarization in the X direction to change the polarization direction of the prepulse laser light PPL into the Y direction. That is, the λ/2 wavelength plate 141 changes the polarization direction of the prepulse laser light PPL when being radiated to the droplet target DL to the Y direction which is perpendicular to the XZ plane including the center axis C1 of the EUV light 101 traveling from the plasma generation region AR to the EUV light concentrating mirror 75 and the center axis C2 of the EUV light 101 reflected by the EUV light concentrating mirror 75.

5.2 Effect

Figure 12:
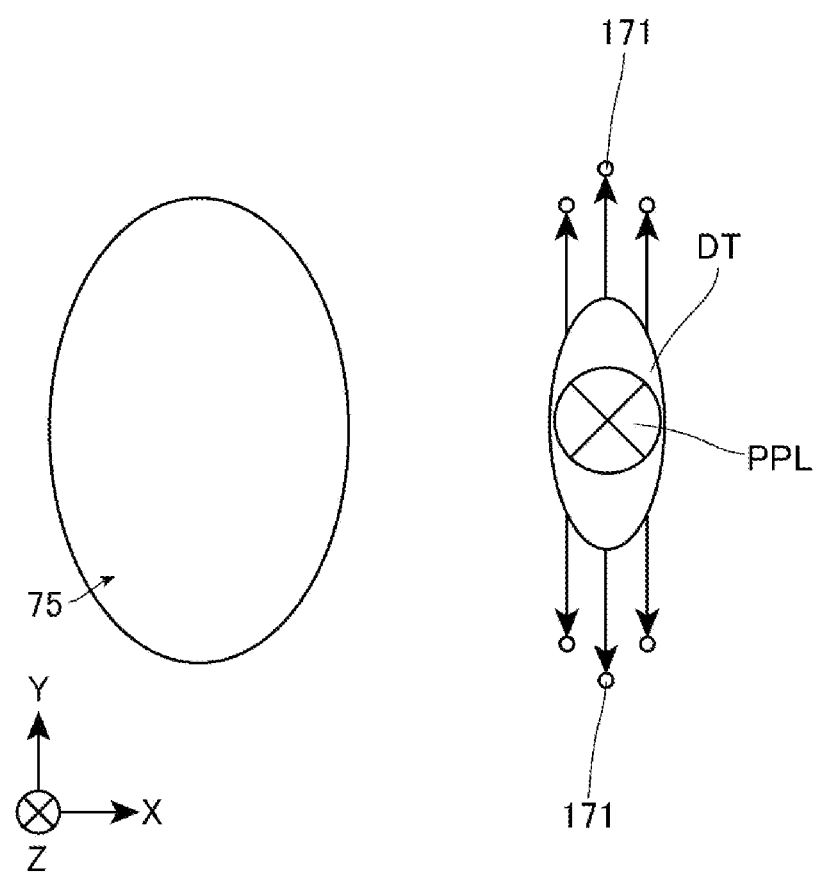
FIG. 12 is a view of the diffusion target shown in FIG. 11 viewed from the Z direction.

FIG. 12 is a view of the diffusion target DT shown in FIG. 11 viewed from the Z direction. As shown in FIGS. 11 and 12, the EUV light concentrating mirror 75 of the present embodiment is arranged at a position laterally offset from the optical axis of the prepulse laser light PPL when being radiated to the droplet target DL so as not to cross a straight line passing through the plasma generation region AR and extending in the polarization direction of the prepulse laser light PPL when being radiated to the droplet target DL. The diffusion target DT generated by the prepulse laser light PPL having polarization in the Y direction tends to spread in the Y direction which is the polarization direction of the prepulse laser light PPL when being radiated to the droplet target DL. The debris 171 generated from the diffusion target DT tends to scatter in the Y direction. Therefore, scattering of the debris 171 to the EUV light concentrating mirror 75 can be suppressed. Further, since the adhesion of the debris 171 to the EUV light concentrating mirror 75 is suppressed, failure of the EUV light generation apparatus 100 can be suppressed.

6. Description of Extreme Ultraviolet Light Generation Apparatus of Third Embodiment Next, the configuration of the EUV light generation apparatus 100 of a third embodiment will be described. Any component same as that described above is denoted by an identical reference sign, and duplicate description thereof is omitted unless specific description is needed.

6.1 Configuration

Figure 13:
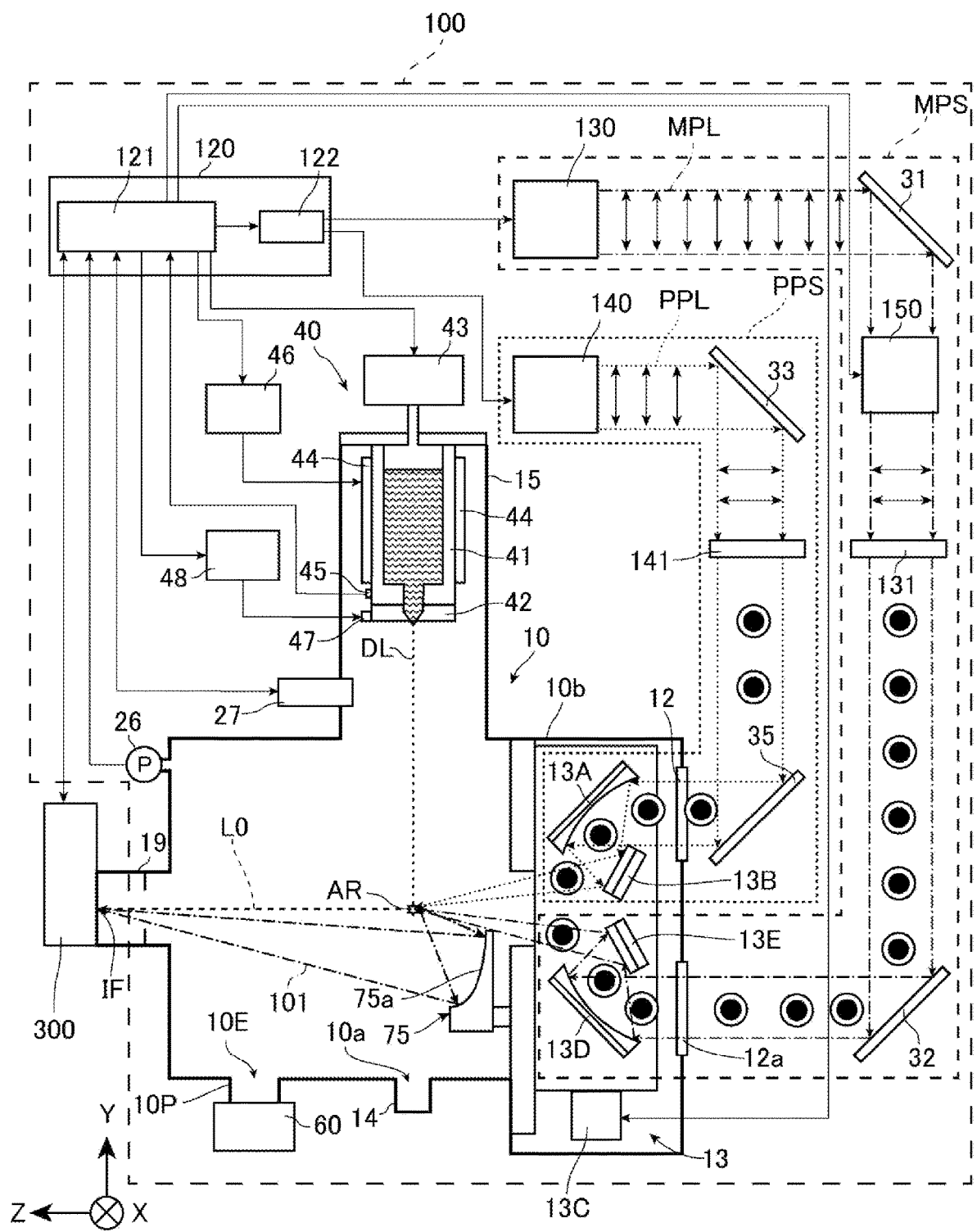
FIG. 13 is a schematic view showing a schematic configuration example of the entire extreme ultraviolet light generation apparatus of a third embodiment.

FIG. 13 is a schematic view showing a schematic configuration example of the entire EUV light generation apparatus 100 of the present embodiment. In the EUV light generation apparatus 100 of the present embodiment, the configurations of the main pulse laser light irradiation system MPS and the prepulse laser light irradiation system PPS are different from those of the second embodiment.

The main pulse laser light irradiation system MPS of the present embodiment includes the main pulse laser device 130, the mirrors 31, 32, the shaping unit 150, a λ/2 wavelength plate 131, a laser light concentrating mirror 13D, and a high reflection mirror 13E.

Figure 14:
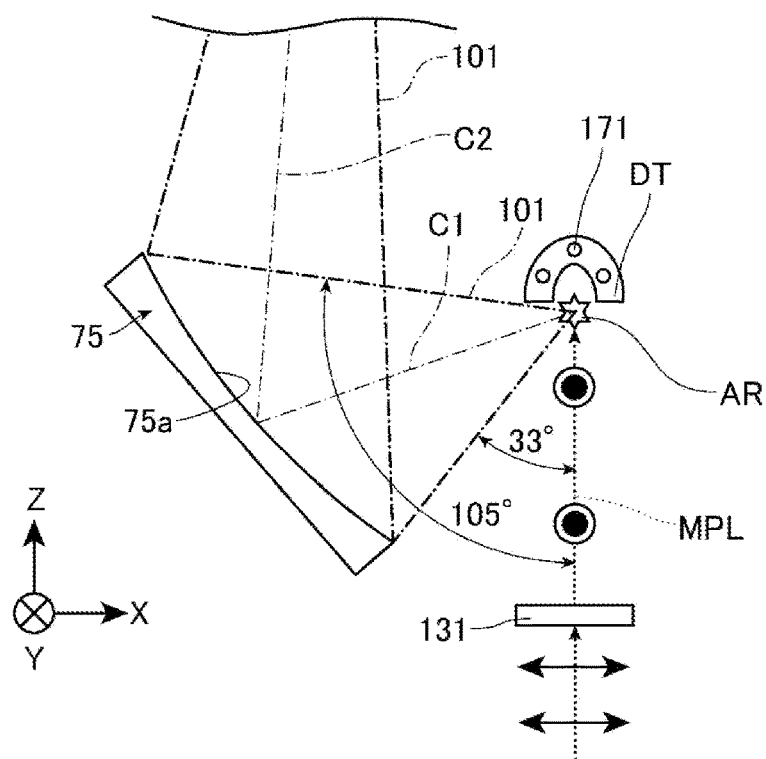
FIG. 14 is a view of the diffusion target irradiated with the main pulse laser light having polarization in the Y direction viewed from the Y direction.

The λ/2 wavelength plate 131 is arranged on the downstream side of the shaping unit 150 in the travel direction of the main pulse laser light MPL. FIG. 13 shows an example in which the λ/2 wavelength plate 131 is arranged on the upstream side of the mirror 32. FIG. 14 is a view of the diffusion target DT irradiated with the main pulse laser light MPL having polarization in the Y direction viewed from the Y direction. The λ/2 wavelength plate 131 changes the polarization direction of the main pulse laser light MPL when being radiated to the diffusion target DT from the optical axis of the main pulse laser light MPL when being radiated to the diffusion target DT to a direction different from the direction toward the EUV light concentrating mirror 75. The λ/2 wavelength plate 131 rotates the polarization direction of the main pulse laser light MPL having polarization in the X direction to change the polarization direction of the main pulse laser light MPL into the Y direction. That is, the λ/2 wavelength plate 131 changes the polarization direction of the main pulse laser light MPL when being radiated to the diffusion target DT to the Y direction which is perpendicular to the XZ plane including the center axis C1 and the center axis C2. As shown in FIG. 13, the main pulse laser light MPL is reflected by the mirror 32, passes through a window 12a provided on the inner wall 10b of the chamber device 10, and travels to the laser light concentrating mirror 13D.

The laser light concentrating mirror 13D and the high reflection mirror 13E are included in the laser light concentrating optical system 13, and are arranged at the internal space of the chamber device 10. The laser light concentrating mirror 13D reflects and concentrates the main pulse laser light MPL having passed through the window 12a. The high reflection mirror 13E reflects the light concentrated by the laser light concentrating mirror 13D toward the plasma generation region AR. Positions of the laser light concentrating mirror 13D and the high reflection mirror 13E are adjusted by the laser light manipulator 13C so that the light concentration position of the main pulse laser light MPL at the internal space of the chamber device 10 coincides with a position specified by the processor 121. The light concentration position is adjusted so as to be positioned directly below the nozzle 42.

The prepulse laser light irradiation system PPS of the present embodiment includes the prepulse laser device 140, the mirror 33, the λ/2 wavelength plate 141, a mirror 35, the laser light concentrating mirror 13A, and the high reflection mirror 13B.

The mirror 35 is arranged between the λ/2 wavelength plate 141 and the laser light concentrating mirror 13A, and reflects the prepulse laser light from the λ/2 wavelength plate 141 toward the laser light concentrating mirror 13A.

In the present embodiment, since the main pulse laser light MPL and the prepulse laser light PPL has the same polarization, that is, polarization in the X direction, a polarizer is not used. Further, since the main pulse laser light MPL and the prepulse laser light PPL of the present embodiment have the same wavelength, a dichroic mirror is not used. Since the polarizer and the dichroic mirror are not used, the optical path of the main pulse laser light MPL and the optical path of the prepulse laser light PPL of the present embodiment are divided and do not overlap at the upstream of the plasma generation region AR. Here, in the case that the main pulse laser light MPL and the prepulse laser light PPL have different wavelengths, the dichroic mirror may be used and the optical path of the main pulse laser light MPL and the optical path of the prepulse laser light PPL may overlap at the downstream side of the λ/2 wavelength plates 131, 141 due to the dichroic mirror.

6.2 Effect

Figure 15:
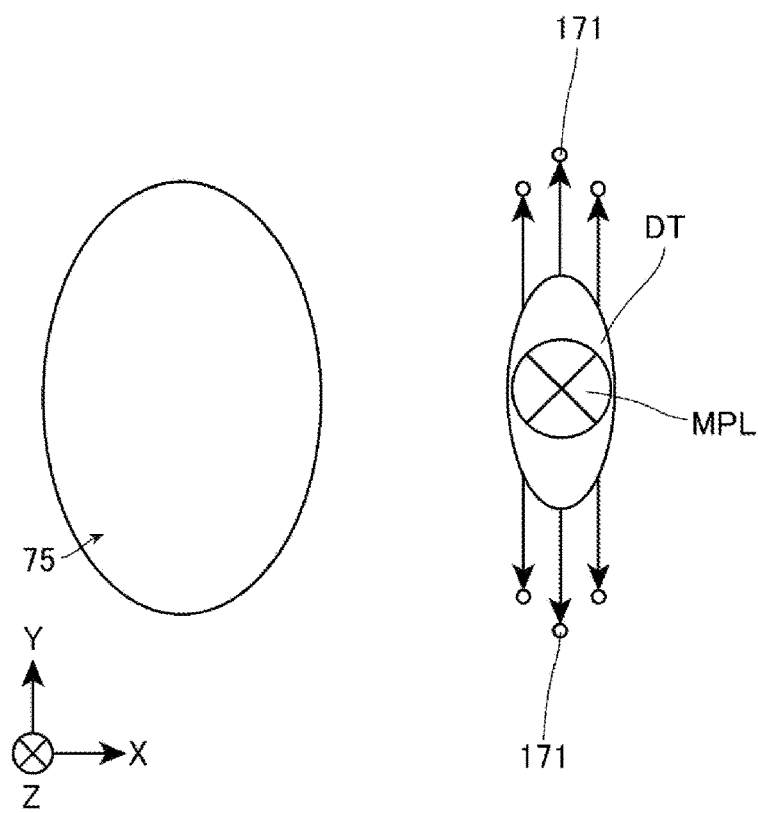
FIG. 15 is a view of the diffusion target shown in FIG. 14 viewed from the Z direction.

FIG. 15 is a view of the diffusion target DT shown in FIG. 14 viewed from the Z direction. As shown in FIGS. 14 and 15, the EUV light concentrating mirror 75 of the present embodiment is arranged at a position laterally offset from the optical axis of the main pulse laser light MPL when being radiated to the diffusion target DT so as not to cross a straight line passing through the plasma generation region AR and extending in the polarization direction of the main pulse laser light MPL when being radiated to the diffusion target DT. When the diffusion target DT is irradiated with the main pulse laser light MPL having polarization in the Y direction, the diffusion target DT tends to spread in the Y direction which is the polarization direction of the main pulse laser light MPL when being radiated to the diffusion target DT. The debris 171 generated from the diffusion target DT tends to scatter in the Y direction. Therefore, scattering of the debris 171 to the EUV light concentrating mirror 75 can be suppressed. Further, since the adhesion of the debris 171 to the EUV light concentrating mirror 75 is suppressed, failure of the EUV light generation apparatus 100 can be suppressed.

The description above is intended to be illustrative and the present disclosure is not limited thereto. Therefore, it would be obvious to those skilled in the art that various modifications to the embodiments of the present disclosure would be possible without departing from the spirit and the scope of the appended claims.

Further, it would be also obvious to those skilled in the art that embodiments of the present disclosure would be appropriately combined. The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generation apparatus, comprising:
   a target supply unit configured to output a droplet target into a chamber device;
   a prepulse laser light irradiation system configured to irradiate the droplet target with prepulse laser light having linear polarization to generate a diffusion target;
   a main pulse laser light irradiation system configured to irradiate the diffusion target with main pulse laser light to generate extreme ultraviolet light; and
   an extreme ultraviolet light concentrating mirror configured to reflect the extreme ultraviolet light,
   a cross section perpendicular to an optical axis of the main pulse laser light when being radiated to the diffusion target having a shape longer in a polarization direction of the prepulse laser light when being radiated to the droplet target than in directions other than the polarization direction,
   wherein the main pulse laser light when being radiated to the diffusion target has linear polarization, and a polarization direction of the main pulse laser light when being radiated to the diffusion target is perpendicular to a plane including a center axis of the extreme ultraviolet light traveling to the extreme ultraviolet light concentrating mirror and a center axis of the extreme ultraviolet light reflected by the extreme ultraviolet light concentrating mirror.

2. The extreme ultraviolet light generation apparatus according to claim 1,
wherein the cross section of the main pulse laser light when being radiated to the diffusion target has an elliptical shape.

3. The extreme ultraviolet light generation apparatus according to claim 1,
wherein the main pulse laser light irradiation system includes a shaping unit configured to shape the cross section of the main pulse laser light when being radiated to the diffusion target to a shape longer in the polarization direction of the prepulse laser light when being radiated to the droplet target than in directions other than the polarization direction.

4. The extreme ultraviolet light generation apparatus according to claim 3,
further comprising an optical path combining member arranged at a position where an optical path of the prepulse laser light intersects with an optical path of the main pulse laser light and configured to overlap the optical path of the prepulse laser light and the optical path of the main pulse laser light,
wherein the shaping unit is arranged on an upstream side of the optical path combining member in a travel direction of the main pulse laser light.

5. The extreme ultraviolet light generation apparatus according to claim 3,
wherein the shaping unit includes a cylindrical concave lens, a cylindrical convex lens which faces the cylindrical concave lens, and an actuator configured to move at least one of the cylindrical concave lens and the cylindrical convex lens to adjust a distance between the cylindrical concave lens and the cylindrical convex lens.

6. The extreme ultraviolet light generation apparatus according to claim 1,
wherein the extreme ultraviolet light concentrating mirror is arranged at a position laterally offset from the optical axis of the main pulse laser light when being radiated to the diffusion target so as not to cross a straight line passing through a plasma generation region where the extreme ultraviolet light is generated and extending in the polarization direction of the main pulse laser light when being radiated to the diffusion target.

7. The extreme ultraviolet light generation apparatus according to claim 1,
wherein the main pulse laser light irradiation system includes a $\lambda/2$ wavelength plate configured to change the polarization direction of the main pulse laser light when being radiated to the diffusion target to a direction perpendicular to the plane including the center axis of the extreme ultraviolet light traveling to the extreme ultraviolet light concentrating mirror and the center axis of the extreme ultraviolet light reflected by the extreme ultraviolet light concentrating mirror.

8. The extreme ultraviolet light generation apparatus according to claim 7,
wherein the main pulse laser light irradiation system includes a shaping unit configured to shape the cross section of the main pulse laser light when being radiated to the diffusion target to a shape longer in the polarization direction of the prepulse laser light when being radiated to the droplet target than in directions other than the polarization direction, and
the $\lambda/2$ wavelength plate is arranged on a downstream side of the shaping unit in a travel direction of the main pulse laser light.

9. The extreme ultraviolet light generation apparatus according to claim 1,
wherein the polarization direction of the prepulse laser light when being radiated to the droplet target is perpendicular to the plane including the center axis of the extreme ultraviolet light traveling to the extreme ultraviolet light concentrating mirror and the center axis of the extreme ultraviolet light reflected by the extreme ultraviolet light concentrating mirror.

10. The extreme ultraviolet light generation apparatus according to claim 9,
wherein the extreme ultraviolet light concentrating mirror is arranged at a position laterally offset from the optical axis of the prepulse laser light when being radiated to the droplet target so as not to cross a straight line passing through a plasma generation region where the extreme ultraviolet light is generated and extending in the polarization direction of the prepulse laser light when being radiated to the droplet target.

11. The extreme ultraviolet light generation apparatus according to claim 9,
wherein the prepulse laser light irradiation system includes a $\lambda/2$ wavelength plate configured to change the polarization direction of the prepulse laser light when being radiated to the droplet target to a direction perpendicular to the plane including the center axis of the extreme ultraviolet light traveling to the extreme ultraviolet light concentrating mirror and the center axis of the extreme ultraviolet light reflected by the extreme ultraviolet light concentrating mirror.

12. The extreme ultraviolet light generation apparatus according to claim 11,
further comprising an optical path combining member arranged at a position where an optical path of the prepulse laser light intersects with an optical path of the main pulse laser light and configured to overlap the optical path of the prepulse laser light and the optical path of the main pulse laser light,
wherein the $\lambda/2$ wavelength plate is arranged on an upstream side of the optical path combining member in the travel direction of the prepulse laser light.

13. The extreme ultraviolet light generation apparatus according to claim 1,
wherein the main pulse laser light and the prepulse laser light have different wavelengths from each other.

14. The extreme ultraviolet light generation apparatus according to claim 1,
wherein the main pulse laser light and the prepulse laser light have the same wavelength.

15. An electronic device manufacturing method, comprising:
inspecting a defect of a mask by irradiating the mask with extreme ultraviolet light generated with an extreme ultraviolet light generation apparatus;
selecting a mask using a result of the inspection; and
exposing and transferring a pattern formed on the selected mask onto a photosensitive substrate,
the extreme ultraviolet light generation apparatus including:

a target supply unit configured to output a droplet target into a chamber device;

a prepulse laser light irradiation system configured to irradiate the droplet target with prepulse laser light having linear polarization to generate a diffusion target;

a main pulse laser light irradiation system configured to irradiate the diffusion target with main pulse laser light to generate extreme ultraviolet light; and an extreme ultraviolet light concentrating mirror configured to reflect the extreme ultraviolet light, and a cross section perpendicular to an optical axis of the main pulse laser light when being radiated to the diffusion target having a shape longer in a polarization direction of the prepulse laser light when being radiated to the droplet target than in directions other than the polarization direction, wherein the main pulse laser light when being radiated to the diffusion target has linear polarization, and a polarization direction of the main pulse laser light when being radiated to the diffusion target is perpendicular to a plane including a center axis of the extreme ultraviolet light traveling to the extreme ultraviolet light concentrating mirror and a center axis of the extreme ultraviolet light reflected by the extreme ultraviolet light concentrating mirror.

* * * * *